United States Patent
Wada

(10) Patent No.: US 7,271,504 B2
(45) Date of Patent: Sep. 18, 2007

(54) POWER-ON RESET SEMICONDUCTOR AND METHOD OF CONTROLLING POWER SUPPLY VOLTAGE

(75) Inventor: Osamu Wada, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 232 days.

(21) Appl. No.: 10/226,133

(22) Filed: Aug. 23, 2002

(65) Prior Publication Data

US 2003/0038666 A1 Feb. 27, 2003

(30) Foreign Application Priority Data

Aug. 24, 2001 (JP) .............................. 2001-254811

(51) Int. Cl.
  *H03L 5/00* (2006.01)
  *H02J 1/00* (2006.01)
(52) U.S. Cl. ........................................ 307/85; 327/143
(58) Field of Classification Search ................. 307/85; 365/226, 189.11, 227; 327/143, 333, 540
See application file for complete search history.

(56) References Cited

U.S. PATENT DOCUMENTS

| 4,636,905 | A | * | 1/1987 | Morimoto et al. | .......... 360/137 |
|---|---|---|---|---|---|
| 5,369,310 | A | * | 11/1994 | Badyal et al. | ............... 327/143 |
| 5,969,542 | A | * | 10/1999 | Maley et al. | .................. 326/81 |
| 6,160,431 | A | * | 12/2000 | Crotty | ......................... 327/143 |
| 6,166,561 | A | * | 12/2000 | Fifield et al. | .................. 326/57 |
| 6,353,355 | B2 | * | 3/2002 | Kato | ........................... 327/535 |
| 6,445,558 | B1 | * | 9/2002 | Matsumoto et al. | ......... 361/104 |
| 6,822,493 | B2 | * | 11/2004 | Hirano et al. | ................ 327/143 |

FOREIGN PATENT DOCUMENTS

JP          63-314914          12/1988

* cited by examiner

*Primary Examiner*—Michael Sherry
*Assistant Examiner*—Adi Amrany
(74) *Attorney, Agent, or Firm*—Oblon, Spivak, McClelland, Maier & Neustadt, P.C.

(57) ABSTRACT

A semiconductor integrated circuit includes a first logic circuit to which a first power supply voltage is applied and which outputs a first signal, a first level conversion circuit to which the first power supply voltage and a second power supply voltage having an amplitude of second voltage level different from the first power supply voltage are supplied and which outputs a second signal, a second logic circuit to which the second power supply voltage is applied and which outputs a third signal, and a second level conversion circuit which 15 connected between the first and second logic circuits, to which the first and second power supply voltages are applied, and which level-converts the third signal of the second voltage level output from the second logic circuit to the first voltage level and outputs a fourth signal.

16 Claims, 13 Drawing Sheets

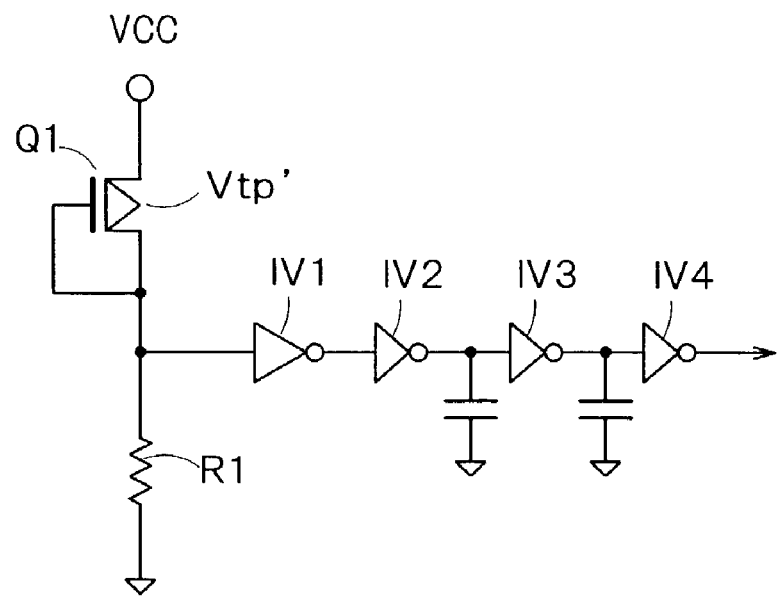
FIG. 4
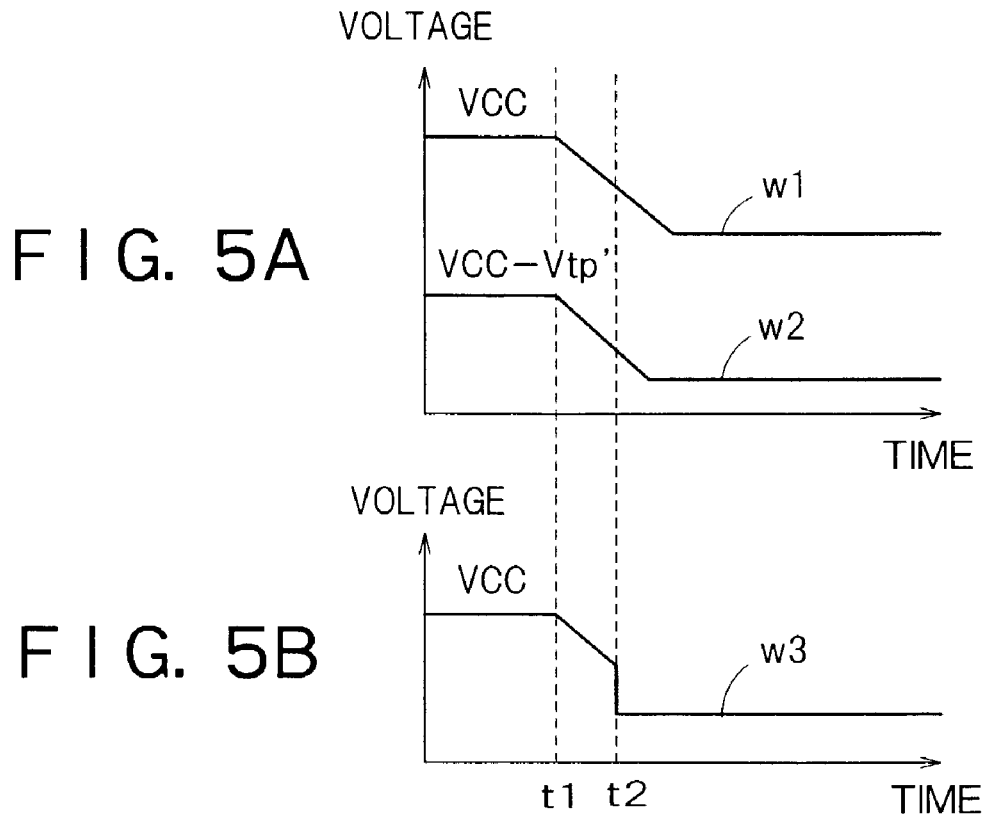
FIG. 5A
FIG. 5B

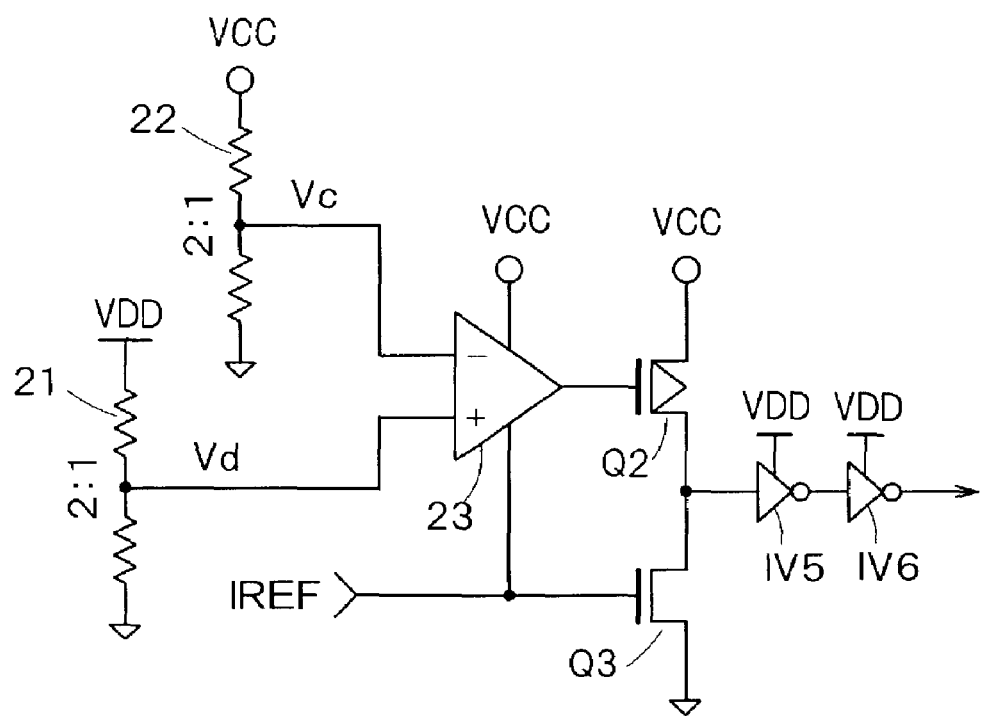
F I G. 6
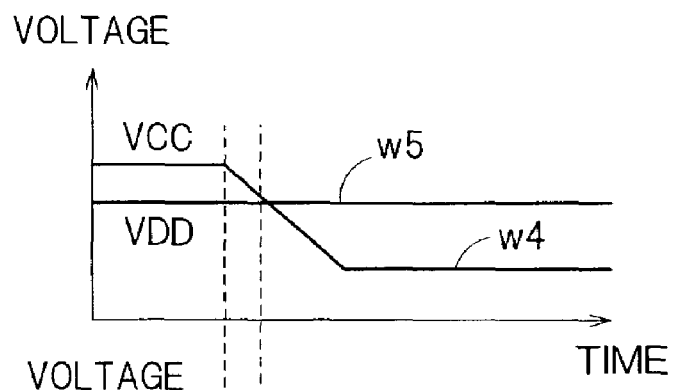
F I G. 7A
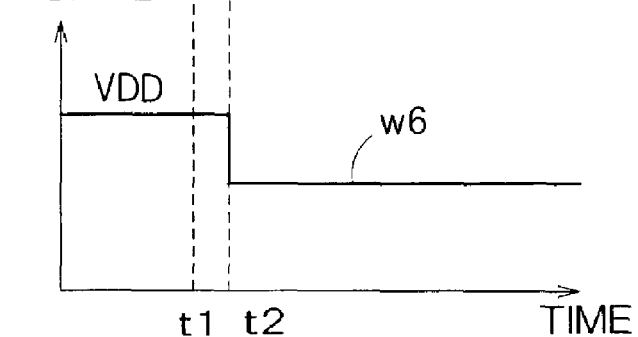
F I G. 7B

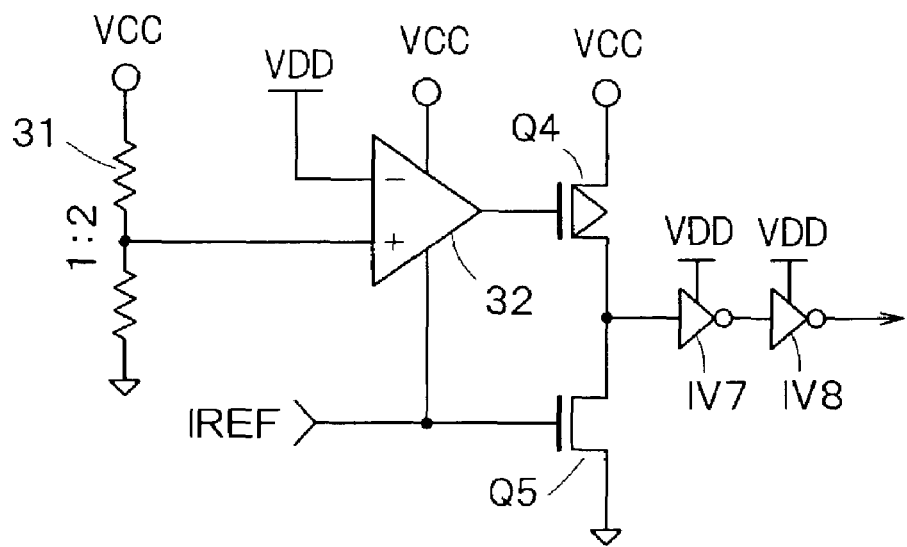
FIG. 8
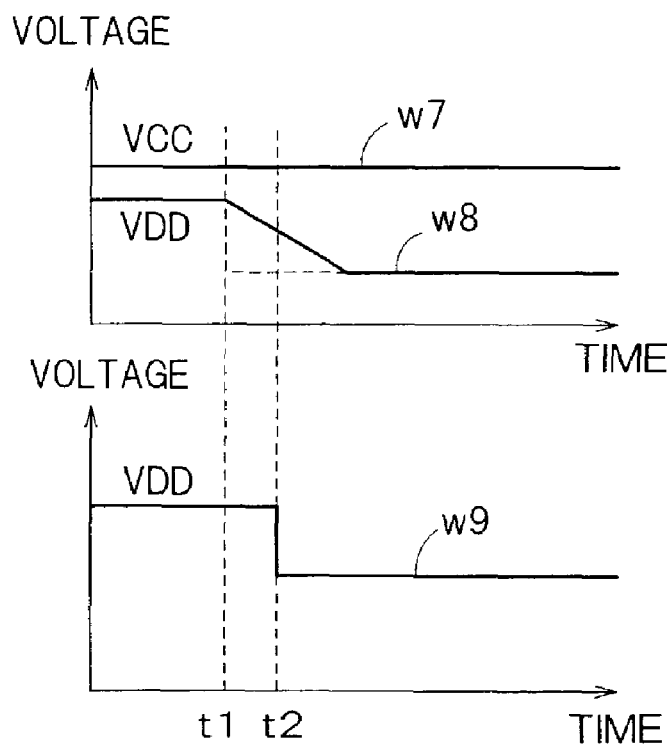
FIG. 9A
FIG. 9B

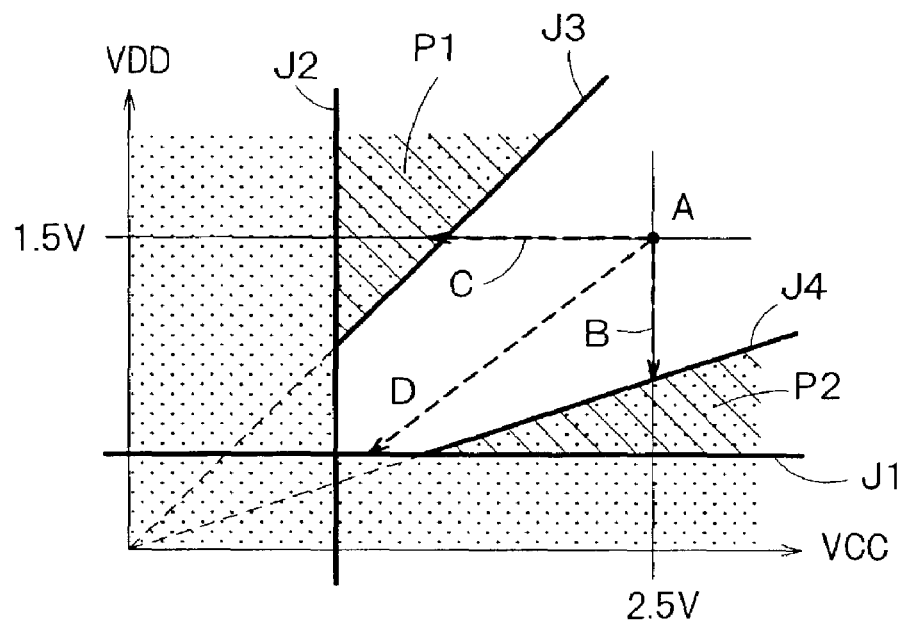
F I G. 10
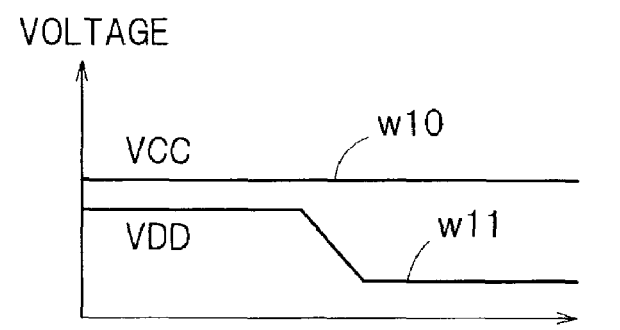
F I G. 11A
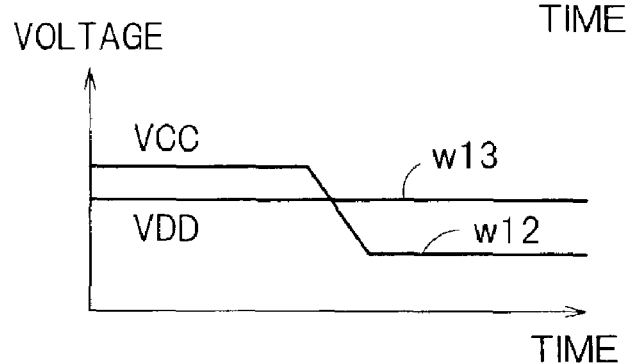
F I G. 11B

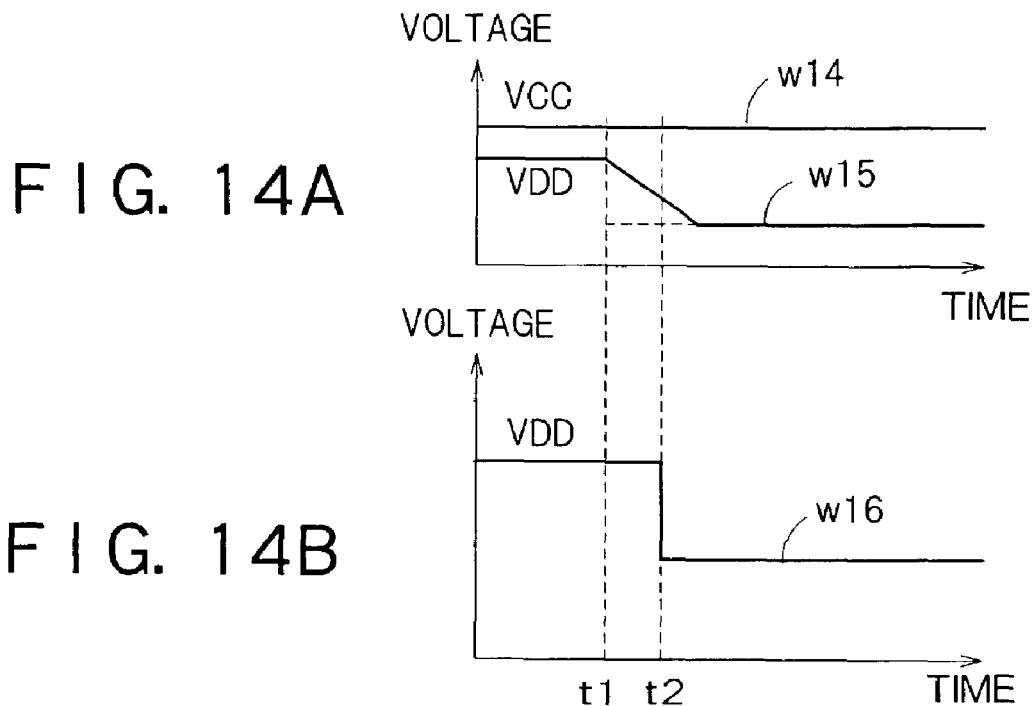
FIG. 14A
FIG. 14B
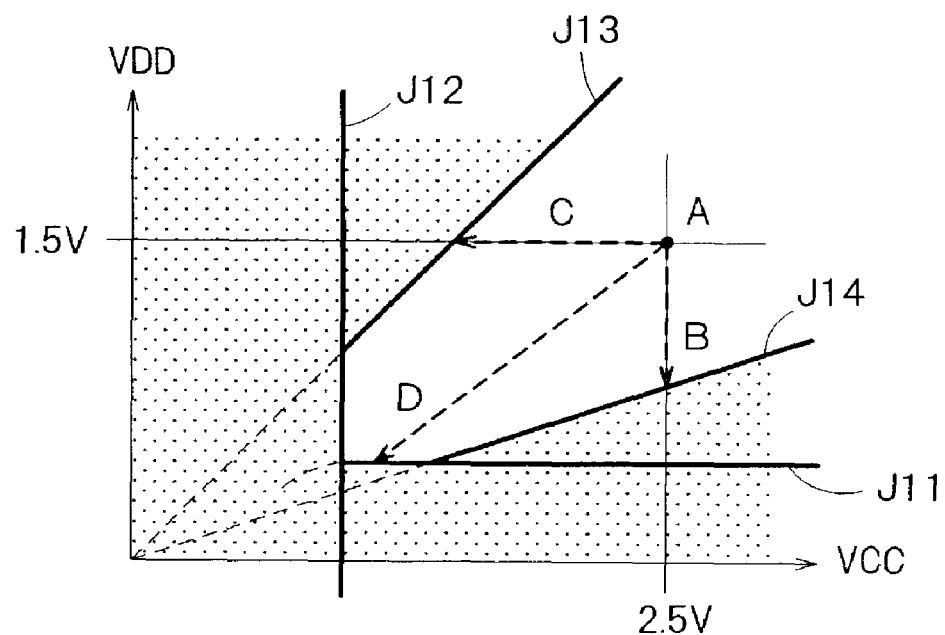
FIG. 15

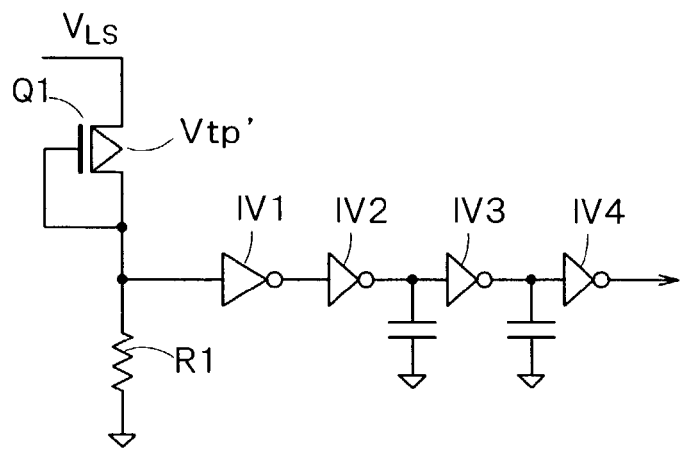
F I G. 17
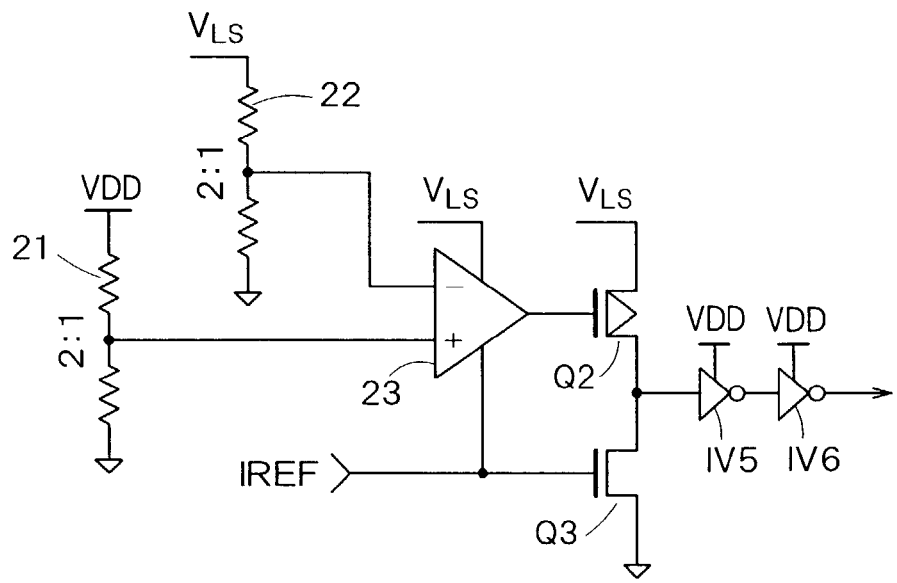
F I G. 18
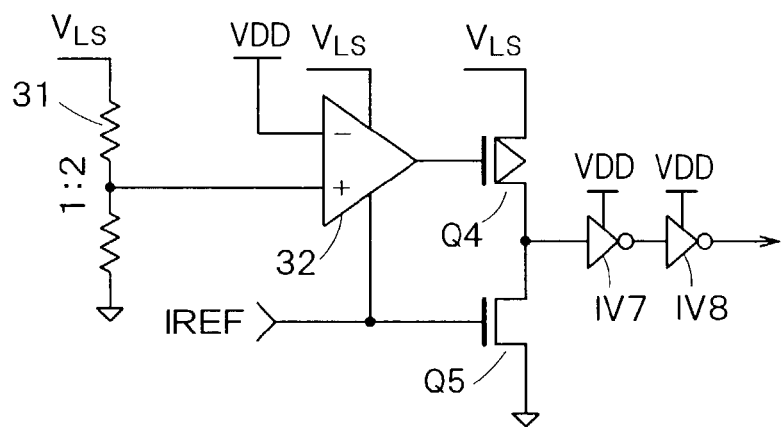
F I G. 19

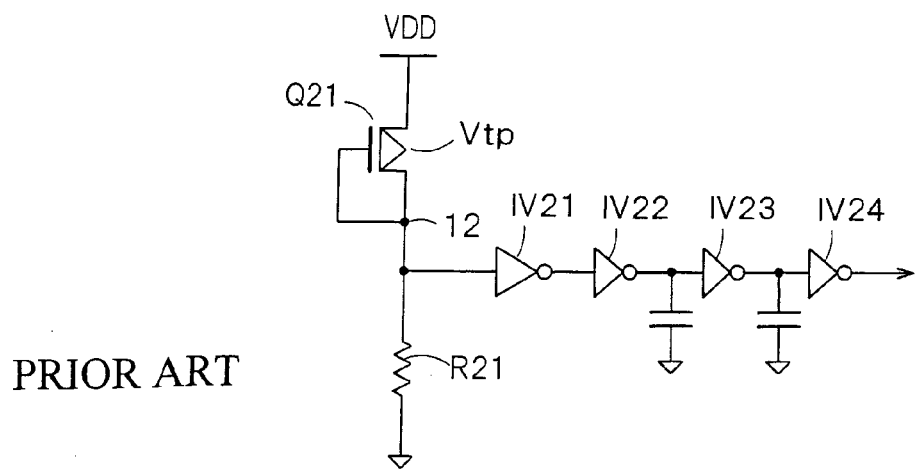
PRIOR ART
F I G. 21
PRIOR ART
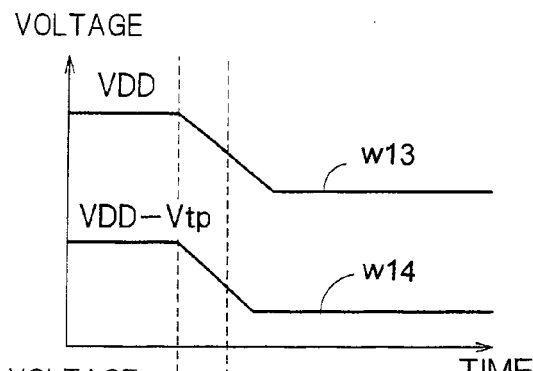
F I G. 22A
F I G. 22B
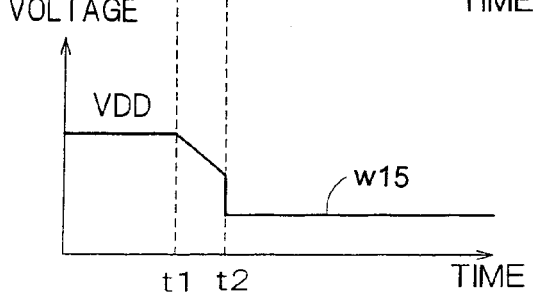
PRIOR ART

POWER-ON RESET SEMICONDUCTOR AND METHOD OF CONTROLLING POWER SUPPLY VOLTAGE

CROSS REFERENCE TO RELATED APPLICATIONS

This application is based upon and claims the benefit of priority from the prior Japanese Patent Applications No. 2001-254811, filed on Aug. 24, 2001, the entire contents of which are incorporated herein by reference.

BACKGROUND OF THE INVENTION

1. Field of the Invention

The present invention relates to a semiconductor device and a method of controlling power supply voltage which drive an internal circuit based on a plurality of power supply voltage. For example, separately from a power supply voltage for a logic circuit, the present invention aims at a semiconductor memory device and so on in which a power supply circuit for a step-up circuit and a step-down circuit is required.

2. Related Background Art

A power supply potential detecting circuit for detecting that an external power supply falls to a certain level and generating a reset signal is conventionally known. The reset signal is an important signal which surely initializes an internal circuit and stops operation of an internal power supply generating circuit, when the external power supply stops unexpectedly, irregularly and instantaneously, or is turned on/off unstably. The power supply potential detecting circuit for generating the reset signal is, for example, composed in manner shown in FIG. 21.

FIGS. 22A-22B are potential wave form diagrams of the circuit of FIG. 21. A waveform w13 of FIG. 22A shows a waveform of an external power supply VDD, a waveform w14 shows a waveform of VDD-Vtp of a PMOS transistor Q21, and a waveform w15 shows an output potential of the circuit of FIG. 21.

In FIG. 21, when the potential of the external power supply VDD falls from the constant potential state at time t1 of FIG. 22A, a gate potential and a drain potential (node 12) of a PMOS transistor Q21 with a threshold voltage Vtp gradually falls from VDD-Vtp as shown in FIG. 22B. The potential of the node 12 falls, and at time point t2 when the potential of node 12 becomes lower than a threshold voltage of an NMOS transistor in an inverter IV21, the output potential 14 is turned off as shown in FIG. 22B.

The power supply potential detecting circuit as shown in FIG. 21 is provided by each power supply when there are a plurality of external power supplies provided in the semiconductor device.

However, when using the semiconductor device in which two different external power supplies VDD and VCC are provided, it is likelihood that one or both of external power supplies may stop unexpectedly, irregularly and instantaneously, or break instantaneously. For example, when one external power supply stop or break instantaneously, the external power supply with higher potential among the power supplies VDD and VCC rapidly falls, or the potential of the external power supply with higher potential falls prior to the external power supply with lower potential. Therefore, the potential relationship may be in reverse. When such a reverse of the potential relationship occurs, a junction leak occurs or the internal circuit may malfunction.

SUMMARY OF THE INVENTION

A semiconductor device according to an embodiment of the present invention which operates an internal circuit based on first and second power supply potentials different from each other, comprising:

a first determination circuit which determines whether or not said first power supply potential is higher than a first reference potential;

a second determination circuit which determines whether or not said second power supply potential is higher than a second reference potential;

a third determination circuit which determines whether or not said first power supply potential is higher than said second power supply potential; and a power supply voltage control circuit which operates said internal circuit based on said first and second power supply potentials if all the determinations by said first, second and third determination circuits are yes, and outputs a signal for initializing said internal circuit if the determination by at least one of said first, second and third determination circuits is no.

A semiconductor device according to an embodiment of the present invention which operates an internal circuit based on first and second power supply potentials different from each other, comprising:

a first determination circuit which determines whether or not said first power supply potential is higher than a first reference potential;

a level shift circuit which outputs said first power supply potential only when said second power supply potential is not less than a prescribed power supply potential;

a second determination circuit which determines whether or not said first power supply potential is higher than said second power supply potential; and a power supply voltage control circuit which operates said internal circuit based on said first and second power supply potentials if both of determinations in said first and second determination circuits are yes and said first power supply potential is outputted from said level shift circuit, and outputs a signal for initializing said internal circuit if the determination in at least one of said first and second determination circuits is no, or said first power supply potential is not outputted from said level shift circuit.

BRIEF DESCRIPTION OF THE DRAWINGS

FIG. 4 is a circuit diagram showing internal configuration of a VCC detecting circuit.

FIG. 5 is a potential waveform diagram of a VCC detecting circuit of FIG. 4.

FIG. 6 is a circuit diagram showing internal configuration of a potential comparing circuit.

FIG. 7 is a potential waveform diagram of a potential comparing circuit.

FIG. 8 is a circuit diagram showing internal configuration of a potential comparing circuit.

FIG. 9 is a potential waveform diagram of a potential comparing circuit.

FIG. 10 is a diagram showing operational range of an internal power supply generating circuit.

FIG. 11 is a diagram showing an example in which power supply potentials VDD and VCC stop instantaneously.

FIG. 14 is a potential waveform diagram of a level shift circuit of FIG. 13.

FIG. 15 is a diagram showing operational range of an internal power supply generating circuit.

FIG. 17 is a circuit diagram showing internal configuration of a VLS detecting circuit.

FIG. 18 is a circuit diagram showing internal configuration of a potential comparing circuit.

FIG. 19 is a circuit diagram showing internal configuration of a potential comparing circuit.

FIG. 21 is a circuit diagram showing one example of a conventional power supply potential detecting circuit.

FIG. 22 is a potential waveform diagram of a VDD detecting circuit.

DESCRIPTION OF THE PREFERRED EMBODIMENTS

Hereinafter, a semiconductor device and a method of controlling power supply voltage according to the present invention will be more specifically described with reference to drawings. As an example of the semiconductor device according to the present invention, a system LSI of embedded DRAM will be described hereinafter. At least two types of power supply potentials VDD and VCC (VDD<VCC) are provided to this LSI. The VDD is used as the power supply such as a logic circuit in the LSI and a peripheral circuit of a DRAM, and the VCC is used for a step-up (step-down) circuit for generating a step-up (step-down) voltage used for the DRAM.

(Description of a Fundamental Circuit Diagram According to the Present Invention)

Figure 1:
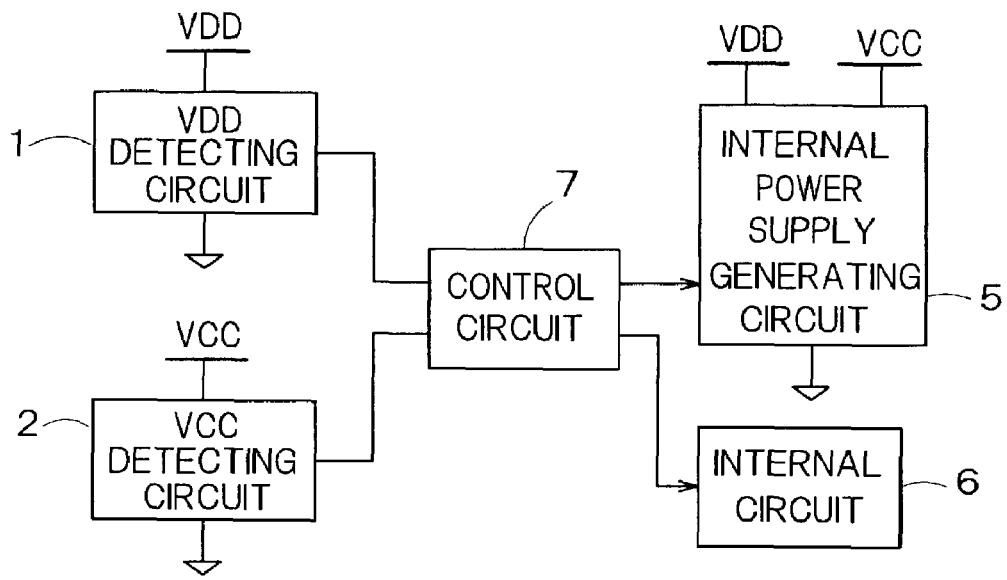
FIG. 1 is a circuit diagram showing a fundamental semiconductor device according to the present invention.

FIG. 1 is a circuit diagram showing a fundamental semiconductor device according to the present invention. The semiconductor device of FIG. 1 is supplied with two different power supply potentials VDD and VCC (VDD<VCC) from outside. The semiconductor device of FIG. 1 has a VDD detecting circuit 1 and a VCC detecting circuit 2 having the same configuration as that of the power supply potential detecting circuit of FIG. 21, and a control circuit 7 for controlling an internal power supply generating circuit 5 and an internal circuit 6 based on the detecting circuits 1 and 2.

The control circuit 7 controls the order in which a plurality of internal potential generating circuits generate the potentials. When the potential levels of the power supply potentials VDD and VCC with stable levels fall, the control circuit 7 stops operation of the internal power supply generating circuit 5 to output a signal for initializing the internal circuit 6.

Figure 2:
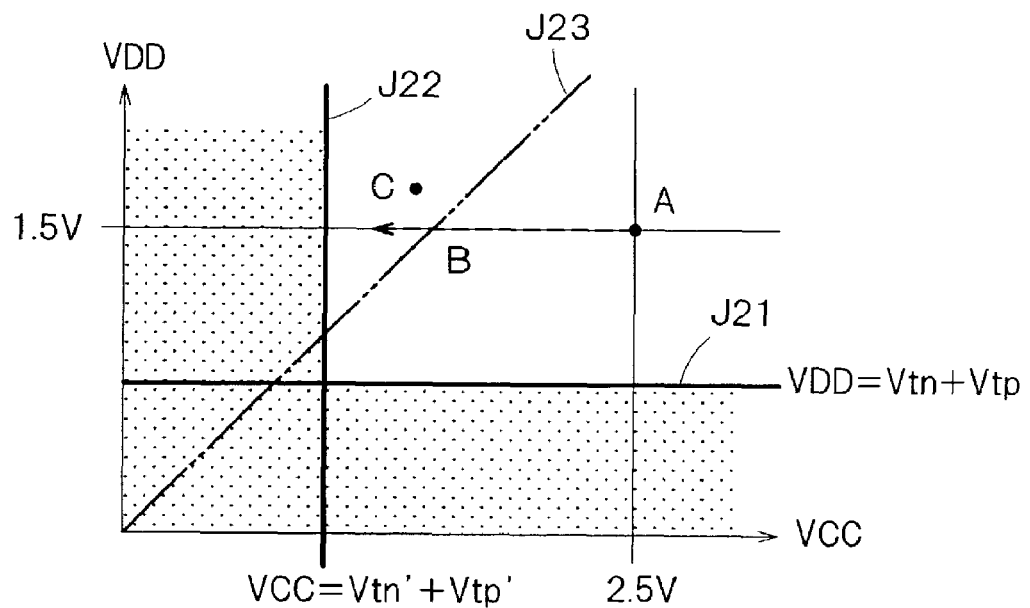
FIG. 2 is a diagram showing operation range of an internal power supply generating circuit.

FIG. 2 is a diagram showing operation range of the internal power supply generating circuit 5, and a hatched area of FIG. 2 shows voltage range in which the internal power supply generating circuit 5 stops operation.

The VDD detecting circuit 1 detects whether or not VDD>Vtn+Vtp is established, when the threshold voltages of an NMOS transistor and a PMOS transistor are Vtn and Vtp, respectively, as shown in a solid line J21 of FIG. 2.

The VCC detecting circuit 2 detects whether or not VCC>Vtn'+Vtp' is established, when the threshold voltages of the NMOS transistor and the PMOS transistor in the VCC detecting circuit 2 are Vtn' and Vtp', respectively. A double-dashed line J23 of FIG. 2 shows a line of VDD=VCC, and the left side of this line shows the state in which the potential of the external power supply is in reverse.

The semiconductor device of FIG. 1 stops the operation of the internal power supply generating circuit 5 and the internal circuit 6, only when the power supply potentials VDD and VCC are within the voltage range of the hatched area of FIG. 2. Because of this, even if the power supply potentials VDD and VCC are in reverse to become abnormal state such as point C, it is impossible to stop of operation of the internal power supply generating circuit 5 and the internal circuit 6.

Because of this, when the potential is in reverse, a junction leak and so on occur in a step-up potential generating circuit and so on in the internal power supply generating circuit 5, and as a result, the circuit may malfunction.

An example of the semiconductor device in which such a problem can be avoided will be described hereinafter.

First Embodiment

Figure 3:
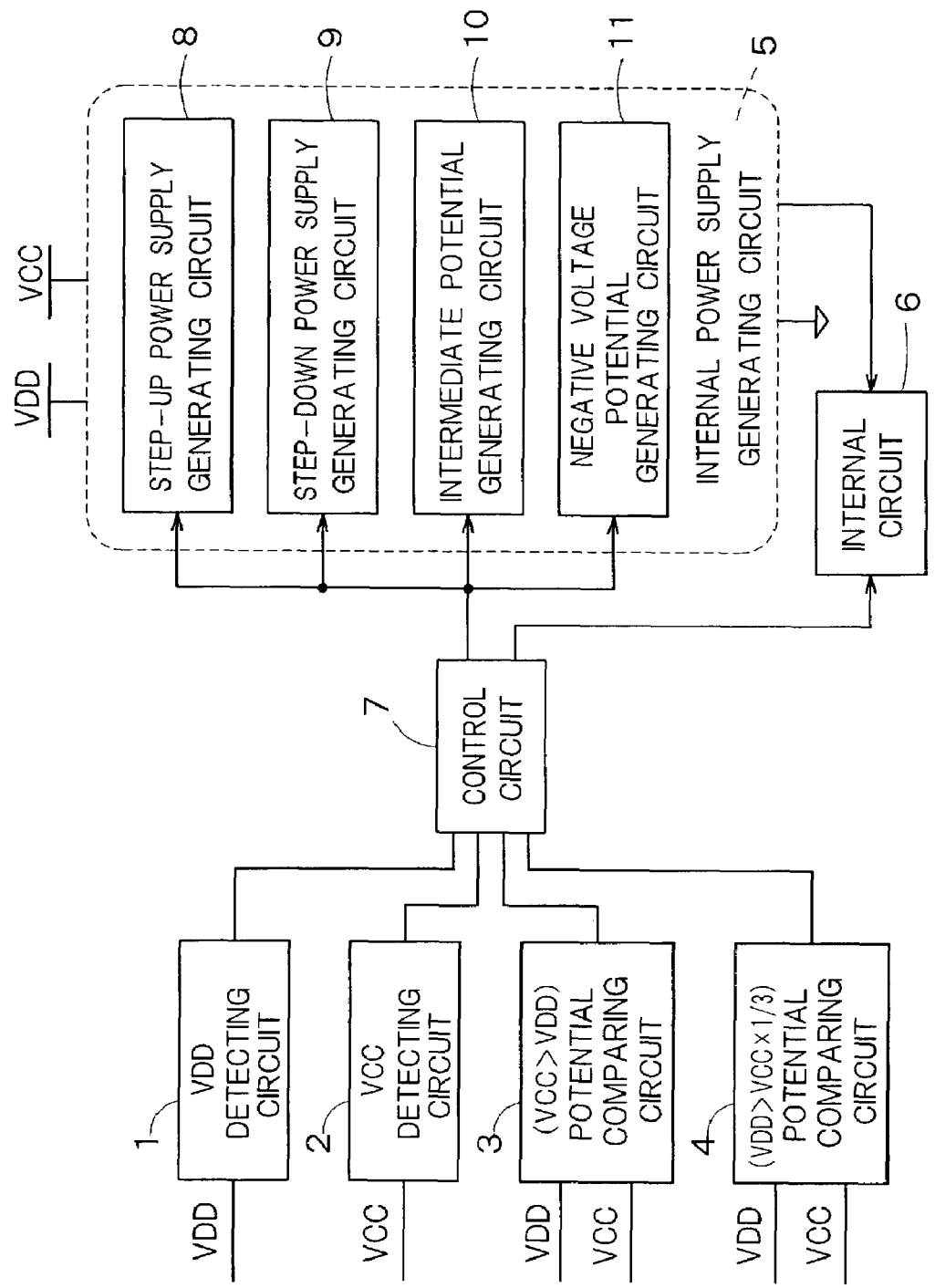
FIG. 3 is a block diagram showing schematic configuration of a first embodiment of a semiconductor device according to the present invention.

FIG. 3 is a block diagram showing schematic configuration of a first embodiment of a semiconductor device according to the present invention. The semiconductor device of FIG. 3 has a VDD detecting circuit 1 for detecting potential level of the power supply potential VDD, a VCC detecting circuit 2 for detecting potential level of the power supply potential VCC, a potential comparing circuit 3 for determining whether or not the power supply potential VCC is higher than the power supply potential VDD, a potential comparing circuit 4 for determining whether or not the power supply VDD is higher than ⅓ of the power supply potential VCC, and the control circuit 7 for controlling whether or not to operate the internal power supply generating circuit 5 and an internal circuit 6 based on the power supply potentials VDD and VCC.

The internal power supply generating circuit 5 includes, for example, a step-up power supply generating circuit 8, a step-down power supply generating circuit 9, an intermediate potential generating circuit 10, a negative voltage power supply generating circuit 11 and so on. The internal power supply generating circuit 5 and the internal circuit 6 are provided with the power supply potentials VCC and VDD.

On the other hand, the internal circuit 6 includes a memory cell, a read-out/write-in control circuit of the memory cell and a sense amplifier. The internal circuit 6 uses the power supply potential VDD and an internal power supply outputted from the internal power supply generating circuit 5 as a driving voltage.

FIG. 4 is a circuit diagram showing internal configuration of the VCC detecting circuit 2. As shown in FIG. 4, the VCC detecting circuit 2 has a PMOS transistor Q1 and a resistor R1 connected in series between a terminal of the power supply potential VCC and a ground terminal, and inverters IV1-IV4 connected in series to the drain terminal of the PMOS transistor Q1.

The gate terminal and the drain terminal of the PMOS transistor Q1 of FIG. 4 are shortcut to each other and function as a diode. The input voltage of the inverter IV1 becomes a voltage in which the threshold voltage Vtp of the PMOS transistor Q1 is subtracted from the power supply potential VCC. At time point when the voltage exceeds the threshold voltage Vtn of an NMOS transistor not shown in the inverter IV1, the VCC detecting circuit 2 outputs a high level voltage. That is, a condition that the VCC detecting circuit 2 outputs the high level voltage is VCC>Vtp'+Vtn'.

FIGS. 5A-5B are a voltage waveform diagram of the VCC detecting circuit 2 of FIG. 4, and shows an example in which the power supply begins falling at time t1. A waveform w1 of FIG. 5A shows the power supply potential VCC, and a waveform w2 of FIG. 5A shows the drain voltage of the PMOS transistor Q1. A waveform w3 of FIG. 5B shows an output voltage of the VCC detecting circuit 2. When the power supply potential VCC begins falling, the drain voltage of the PMOS transistor Q1 also falls in accordance with the falling of the power supply potential VCC. At time t2, the drain voltage of the PMOS transistor Q1 becomes equal to or less than the threshold voltage Vtn of the NMOS transistor in the inverter, and the output of the VCC detecting circuit 2 becomes a low level voltage.

The VDD detecting circuit 1 of the present embodiment has the same configuration as that of the circuit of FIG. 21, i.e. when the external reference potential VDD becomes equal to or less than the threshold voltage of the NMOS transistor in the inverter, the output of the VDD detecting circuit 1 becomes a low level voltage. Thus, the VDD detecting circuit 1 detects whether or not to be VDD>Vtp+Vtn FIG. 6 is a circuit diagram showing internal configuration of the potential comparing circuit 3 of FIG. 3. As shown in FIG. 6, the potential comparing circuit 3 has a resistor dividing circuit 21 for outputting a voltage Vd of ⅔ of the power supply voltage VDD, a resistor dividing circuit 22 for outputting a voltage Vc of ⅔ of the external power supply voltage VCC, a differential amplifier 23 for detecting level difference between the voltage Vd and Vc, a PMOS transistor Q2 and an NMOS transistor Q3 connected in series between a terminal of the power supply potential VCC and the ground terminal, and inverters IV5 and IV6 connected in series at a connecting point of the PMOS transistor Q2 and the NMOS transistor Q3.

The differential amplifier 23 outputs the low level voltage in the case of VCC>VDD, and the high level voltage in the case of VCC≦VDD. When the output of the differential amplifier 23 becomes the low level voltage, the PMOS transistor Q2 turns on, and the potential comparing circuit 3 outputs the high level voltage (power supply. When the output of the differential amplifier 23 becomes the high level voltage, the PMOS transistor Q2 turns off, and the potential comparing circuit 3 outputs the low level voltage.

Thus, the potential comparing circuit 3 outputs the high level voltage in the case of VCC>VDD, and the low level voltage in the case of VCC≦VDD.

The reason why the power supply potentials VDD and VCC are set to ⅓ in the resistor dividing circuits 21 and 22 of FIG. 6 is because when the external power supply voltages VDD and VCC are directly applied to the gate terminals of the transistors in the differential amplifier 23, the transistors in the differential amplifier 23 may be destroyed.

FIGS. 7A-7B are a voltage waveform diagram of the potential comparing circuit 3, and shows an example in which the power supply potential VCC begins falling at time t1. A waveform w4 of FIG. 7A shows the power supply potential VCC, and a waveform w5 shows the power supply potential VDD. A waveform w6 of FIG. 7B shows the output voltage of the potential comparing circuit 3. During VCC>VDD, the output of the differential amplifier 23 is the low level voltage, and the potential comparing circuit 3 outputs the high level voltage.

When the potential relation of the power supply potentials VDD and VCC is in reverse to be VDD>VCC at time t2, the output of the differential amplifier 23 becomes the high level voltage, the PMOS transistor Q2 turns off, and the output of the potential comparing circuit 3 becomes the low level voltage.

FIG. 8 is a circuit diagram showing internal configuration of the potential comparing circuit 4. As shown in FIG. 8, the potential comparing circuit 4 has a resistor dividing circuit 31 for outputting a voltage Vc of ⅓ of the power supply potential VCC, a differential amplifier 32 for detecting level difference between the voltage VDD and Vc, a PMOS transistor Q4 and an NMOS transistor Q5 connected in series between a terminal of the power supply potential VCC and the ground terminal, and inverters IV7 and IV8 connected in series at a connection point of the PMOS transistor Q4 and the NMOS transistor Q5.

FIGS. 9A-9B are a voltage waveform diagram of the potential comparing circuit 4, and shows an example in which the power supply potential VDD begins falling at time t1. A waveform w7 of FIG. 9A shows the power supply potential VCC, and a waveform w8 shows the power supply potential VDD. A waveform w9 of FIG. 9B shows the output voltage of the potential comparing circuit 4. During VDD>VCC/3, the output of the differential amplifier 32 is the low level voltage, the PMOS transistor Q4 turns on, and the output of the potential comparing circuit 4 becomes the high level voltage.

At time t2, if VDD≦VCC/3, the output of the differential amplifier 32 becomes the high level voltage, the PMOS transistor Q4 turns off, and the output of the potential comparing circuit 4 becomes the low level voltage.

Thus, the potential comparing circuit 4 detects whether or not to be VDD>VCC/3.

FIG. 10 is a diagram showing operational range of the internal power supply generating circuit 5, and the hatched area of FIG. 10 shows non-operational range. Upper range than a solid line J1 of FIG. 10 shows the case where the VDD detecting circuit 1 outputs the high level voltage, righter range than a solid line J2 shows the case where the VCC detecting circuit 2 outputs the high level voltage, lower range than a solid line J3 shows the case where the potential comparing circuit 3 outputs the high level voltage, and upper range than a solid line J4 shows the case where the potential comparing circuit 4 outputs the high level voltage.

The voltage range enclosed by the four solid lines J1-J4, that is, the voltage range satisfying four conditions of VDD>Vtp+Vtn, VCC>Vtp'+Vtn', VDD<VCC and VDD>VCC/3 shows the operational range of the internal power supply generating circuit 5 and the internal circuit 6, and the other range shows non-operational range.

FIG. 11 is a diagram showing an example in which the power supply potentials VDD and VCC stop instantaneously. It is assumed that VCC is 2.5V and VDD is 1.5V at ordinary time, and the ordinary operational voltage state exists in a point A of FIG. 10. Here, as shown in FIG. 11A, when the power supply potential VDD stops instantaneously, the operational voltage state moves in arrowhead direction from the point A along a line B of FIG. 10. And then when the operational voltage state crosses with a solid line J3 to be VDD<VCC/3, the output of the potential comparing circuit 4 becomes the low level voltage. Therefore, the control circuit 7 stops the operation of the internal power supply generating circuit 5 and initializes the internal circuit 6.

On the other hand, when the ordinary operational voltage state exists in the point A of FIG. 10, if the power supply potential VCC stops instantaneously as shown in FIG. 11B, the operational voltage state moves in arrowhead direction from the point A to the line C of FIG. 10. And then the operational voltage state crosses with the solid line J3 to be VDD>VCC, the output of the potential comparing circuit 3 becomes the low level voltage. Therefore, the control circuit 7 stops the operation of the internal power supply generating circuit 5, and initializes the internal circuit 6.

When the ordinary operational voltage state exists in the point A of FIG. 10, if the external power supplies VDD and VCC stop instantaneously, the operational voltage state moves, for example, in arrowhead direction from the point A to the line D. And then when the operational voltage state crosses with the solid J1 to be VDD<Vtp+Vtn, the output of the VDD detecting circuit 1 becomes the low level voltage. Therefore, the control circuit 7 stops the operation of the internal power supply generating circuit 5, and initializes the internal circuit 6.

Thus, according to the present invention, when the potential relationship of the power supplies VDD and VCC is in reverse due to instantaneous stop or break, or when the power supply potentials VDD and VCC become lower than the operational voltages of the transistors, the operation of the internal power supply generating circuit 5 is surely stopped to initialize the internal circuit 6, thereby preventing unexpected junction leak and malfunction such as the internal circuit 6.

Especially, the present embodiment sets the operational range of the internal power supply generating circuit 5 taking into consideration the comparing result of the potential comparing circuits 3 and 4. Because of this, it is possible to surely stop the operation of the internal power supply generating circuit 5 at shadow areas of FIG. 10, which was impossible in the conventional circuits.

The shadow area P1 of FIG. 10 shows the area in which the potentials of VCC and VDD are in reverse, even if VCC>Vtp'+Vtn'. In this area, the junction leak and so on may occur. The shadow area P2 shows the area in which operational speed of the internal power supply generating circuit 5 and the internal circuit 6 may become lower, even if VDD>Vtp+Vtn.

Although the potential comparing circuit 4 of FIG. 10 compares the power supply potential VDD with ⅓ of the power supply potential VCC, the compared potential may not be necessarily ⅓, and may be a prescribed value less than 1. The reason why the prescribed value is set to be less than 1 is because the potential is in reverse if the prescribed value is not less than 1.

How to set the prescribed value may be, for example, decided based on the threshold voltage of the used transistor. More specifically, the potential comparing circuit 4 preferably determines whether or not to satisfy the condition of VDD>(the threshold voltages of the transistors+0.2-0.5V) when VCC is in 2.5V.

Similarly, although the potential comparing circuit 3 compares the voltage of ⅔ of the power supply potential VDD with the voltage of ⅔ of the power supply potential VCC, the voltages divided by division ratio besides ⅓ are compared with each other.

Although the above-mentioned control circuit 7 controls the operation of the internal power supply generating circuit 5 and the internal circuit 6 based on the outputs of the VDD detecting circuit 1, the VCC detecting circuit 2 and the potential comparing circuits 3 and 4, the internal power supply generating circuit 5 and so on may be controlled without using the output of the potential comparing circuit 4. In this case, the solid line J4 of FIG. 10 is omitted, and the internal power supply generating circuit 5 and the internal circuit 6 are operated at the voltage range included in the shadow area P2 of FIG. 10. Although the operational speed may become lower, the likelihood of the malfunction decreases. In this case, the potential comparing circuit 4 can be omitted, and the control of the control circuit 7 can also be simplified, thereby reducing the occupied area of the chip.

Second Embodiment

A second embodiment according to the present invention provides a level shift circuit.

Figure 12:
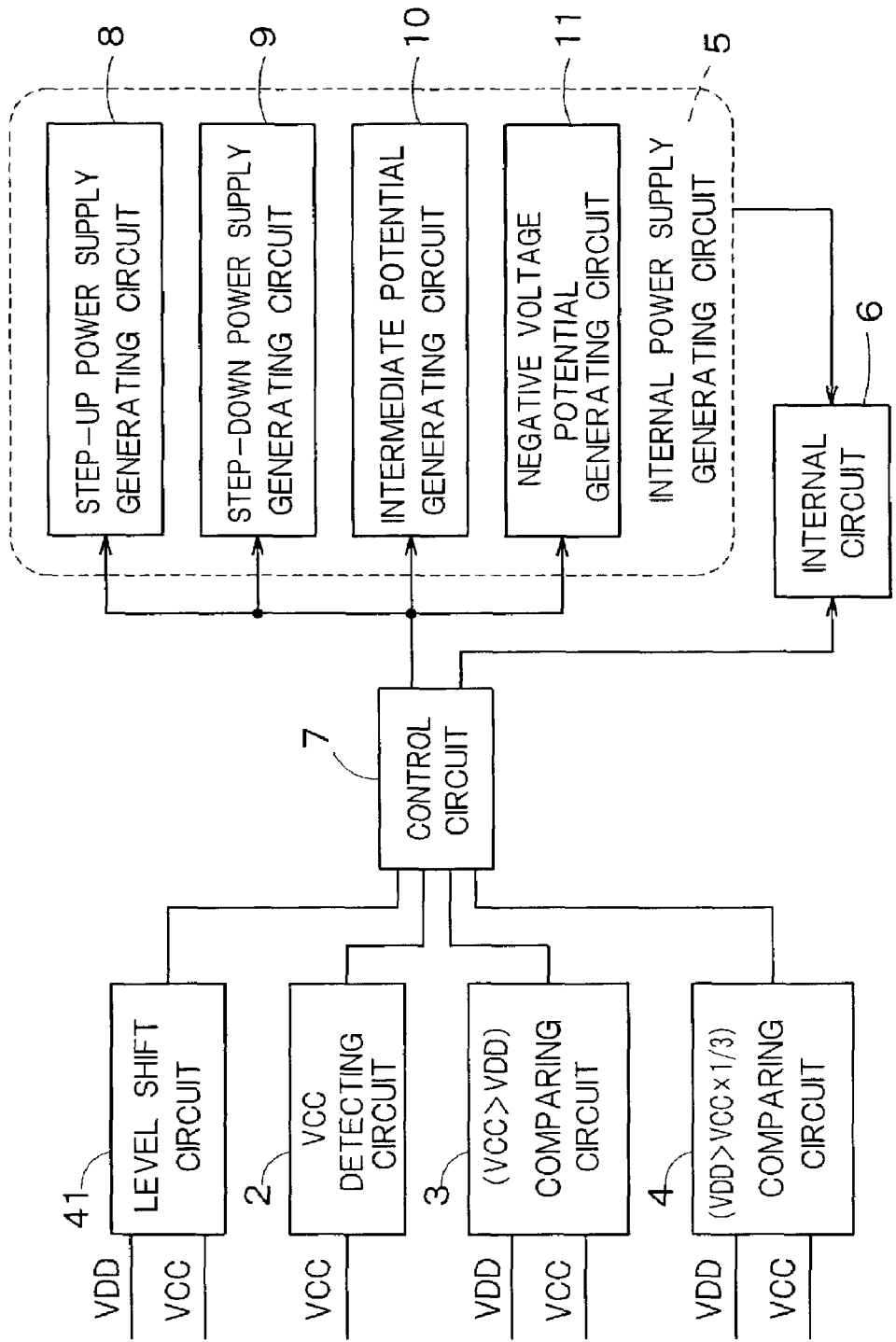
FIG. 12 is a block diagram showing schematic configuration of a second embodiment of a semiconductor device according to the present invention.

FIG. 12 is a block diagram showing schematic configuration of a second embodiment of a semiconductor device according to the present invention. The semiconductor of FIG. 12 has a level shift circuit 41 instead of the VDD detecting circuit 1, and the other configuration is the same as that of the circuit of FIG. 3.

Figure 13:
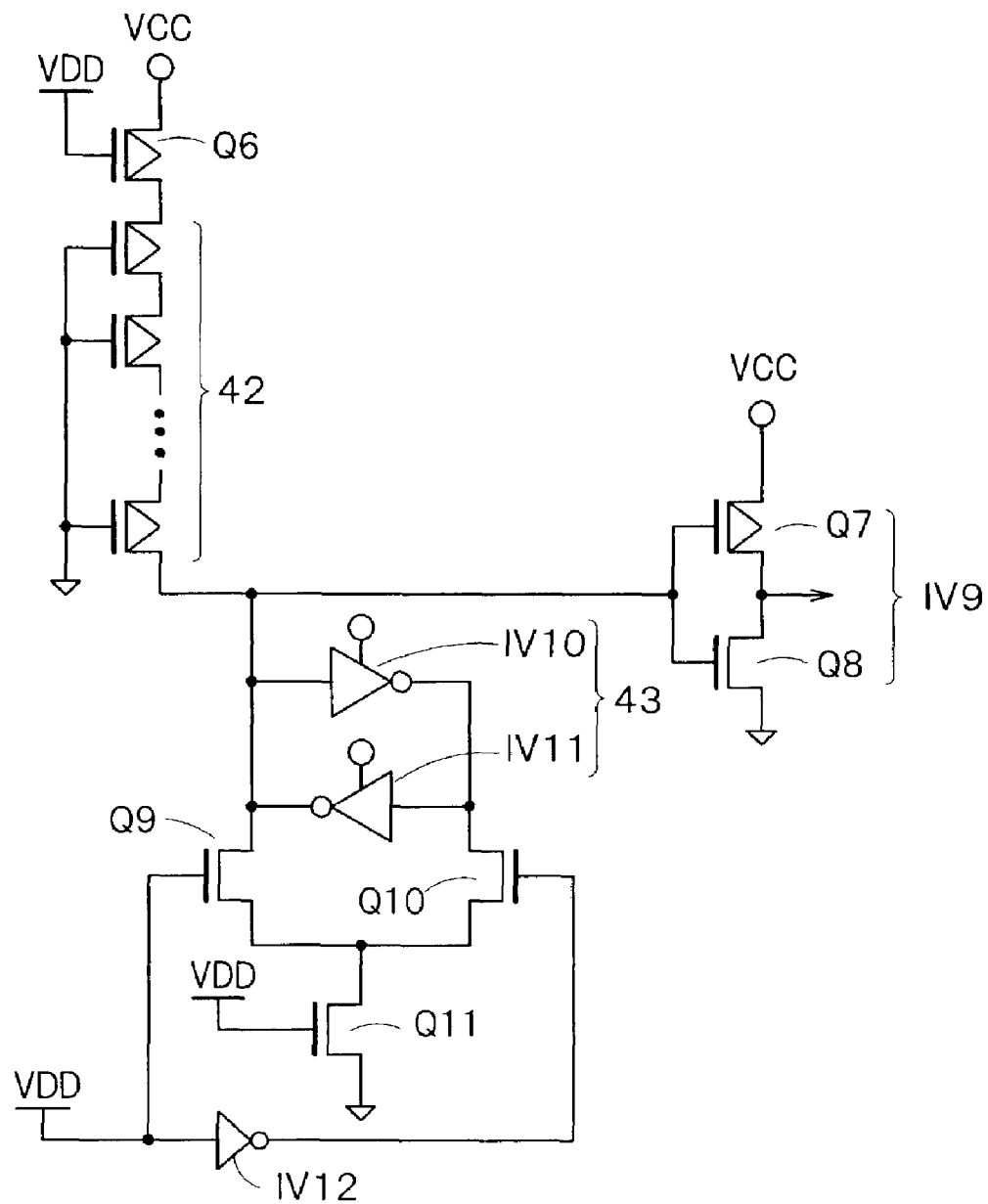
FIG. 13 is a circuit diagram showing internal configuration of a level shift circuit.

The level shift circuit 41 of FIG. 13 outputs the power supply potential VCC only when the power supply potential VDD is not less than the threshold voltages of NMOS transistors in the level shift circuit 41.

FIG. 13 is a circuit diagram showing internal configuration of the level shift circuit 41. The level shift circuit 41 of FIG. 13 has a PMOS transistor Q6 of which a source terminal is supplied with the power supply potential VCC and a gate terminal is supplied with the power supply potential VDD, an inverter IV9 composed of a PMOS transistor Q7 and an NMOS transistor Q8, a charging circuit 42 composed of a plurality of PMOS transistors connected in series between an input terminal of an inverter IV9 and a drain terminal of a PMOS transistor Q6, a latch 43 composed of two inverters IV10 and IV11 connected to an input terminal of an inverter IV9, an NMOS transistor Q9 of which a drain terminal is connected to one end of a latch 43, an NMOS transistor Q10 of which a drain terminal is connected to the other end of the latch 43 and a source terminal is connected to a source terminal of the NMOS transistor Q9, a NMOS transistor Q11 of which a drain terminal is connected to the source terminals of the NMOS transistors Q9 and Q10, a source terminal is grounded and a gate terminal is supplied with the power supply potential VDD, and an inverter IV12 connected between the gate terminals of the NMOS transistors Q9 and Q10.

The gate terminals of a plurality of PMOS transistors composing the charging circuit 42 are grounded, and these PMOS transistors function as resistor elements.

FIGS. 14A-14B are a potential waveform diagram of the level shift circuit 41 of FIG. 13. A waveform w10 of FIG. 14A shows the power supply potential VCC, a waveform w11 shows the power supply potential VDD. A waveform w12 of FIG. 14B shows the output voltage of the level shift circuit 41. It is assumed that until time t1, the power supply potentials VDD and VCC are 1.5V and 2.5V, respectively. At this time, the NMOS transistors Q9 and Q11 are ON state, and the input terminal of the inverter IV9 is the low level voltage. Accordingly, the level shift circuit 41 outputs the power supply potential VCC.

At time t1, the power supply potential VCC begins falling. When the power supply potential VDD becomes less than the threshold voltages of the NMOS transistors Q9 and Q11, the NMOS transistors Q9 and Q11 turn off. At this time, the PMOS transistor Q6 turns on, and the input terminal of the inverter IV9 becomes high level voltage decided by an impedance of the charging circuit 42. Therefore, the output potential of the inverter IV9 is reversed to be low level voltage.

FIG. 15 is a diagram showing operational range of the internal power supply generating circuit 5, and a hatched area of FIG. 15 shows non-operational range of the internal power supply generating circuit 5. Upper range than a solid line J11 of FIG. 15 shows the case where the level shift circuit 41 outputs the external power supply voltage VCC, righter range than a solid line J12 shows the case where the VCC detecting circuit 2 outputs the high level voltage, lower range than a solid line J13 shows the case where the potential comparing circuit 3 outputs the high level voltage, and upper range than a solid line J14 shows the case where the potential comparing circuit 4 outputs the high level voltage.

The voltage range enclosed by four solid lines J11-J14, that is, the voltage range satisfying four conditions of VDD>Vt, VCC>Vtp+Vtn, VDD<VCC and VDD>VCC/3 is the operational range of the internal power supply generating circuit 5, and the other voltage range is non-operational range.

The operation of the semiconductor device of the second embodiment will be described hereinafter. It is assumed that at ordinary time, VCC is 2.5V, VDD is 1.5V and the ordinary operational voltage state exists in the point A of FIG. 15. Here, as shown in FIG. 11A, when the power supply potential VDD stops instantaneously, the operational voltage state moves in arrowhead direction from a point A along a line B of FIG. 15. And then the operational voltage state crosses with the solid line J14 to be VDD≦VCC/3, and the output of the potential comparing circuit 4 becomes low level voltage. Therefore, the control circuit 7 stops operation of the internal power supply generating circuit 5, and initializes the internal circuit 6.

On the other hand, when the ordinary operational voltage state exists in the point A of FIG. 15, the power supply potential VCC stops instantaneously as shown in FIG. 11B, the operational voltage state moves in arrowhead direction from the point A along the line C of FIG. 15. And then the operational voltage state crosses with the solid line J13 to be VDD≦VCC/3, and the output of the potential comparing circuit 4 becomes low level. Therefore, the control circuit 7 stops operation of the internal power supply generating circuit 5, and initializes the internal circuit 6.

When the ordinary operational voltage state moves from the point A to the point D of FIG. 15, that is, when the power supply potentials VDD and VCC becomes lower, the output of the level shift circuit 41 becomes low level at time when the operational voltage state crosses with the solid line J11, and the control circuit 7 stops the operation of the internal power supply generating circuit 5 to output the signal for initializing the internal circuit 6.

Thus, according to the present embodiment, similarly to the first embodiment, due to instantaneous stop or break of the power supply potentials VDD and VCC, when the potential relationship of the power supply potentials VDD and VCC is in reverse, or the power supply potentials VDD and VCC become lower than the operational voltages of the transistors, it is possible to surely stop the operation of the internal power supply generating circuit 5 and initialize the internal circuit 6, thereby preventing unexpected junction leak or malfunction such as the internal circuit 6.

Because the entire level shift circuit 41 of the present embodiment can be composed of the CMOS circuits, the resistor elements with large chip occupied area such as the VDD detection circuit 1 of the first embodiment are unnecessary. Because of this, the restriction on the layout is reduced, thereby downsizing chip size.

Third Embodiment

Although a third embodiment has a level shift circuit 41 similarly to the second embodiment, it has a feature in which it is possible to reduce power consumption.

Figure 16:
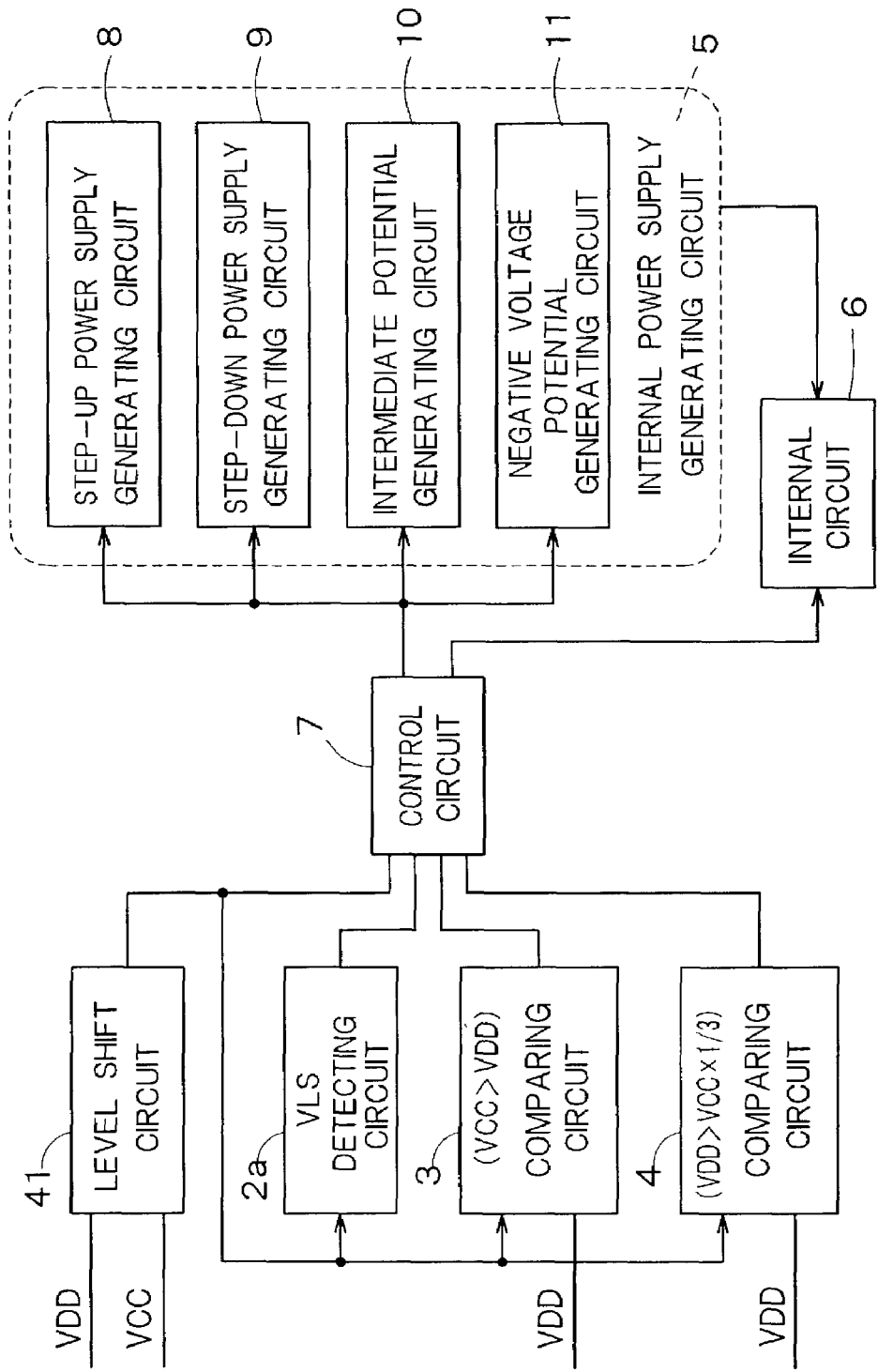
FIG. 16 is a block diagram of a third embodiment of a semiconductor device according to the present invention.

FIG. 16 is a block diagram of a third embodiment of the semiconductor device according to the present invention. The semiconductor device of FIG. 16 has the level shift circuit 41 and a VLS detecting circuit 2a for detecting voltage level, instead of the VDD detecting circuit 1 and the VCC detecting circuit 2. Different from FIG. 12, the output voltage VLS of the level shift circuit 41 is used as the power supply voltages of the VLS detecting circuit 2a and the potential comparing circuits 3 and 4.

FIG. 17 is a circuit diagram showing internal configuration of the VLS detecting circuit 2a. In the VLS detecting circuit 2a of FIG. 17, the source terminal of the PMOS transistor Q1 is supplied with the output voltage VLS of the level shift circuit 41. In this point, the circuit of FIG. 17 is different from the circuit of FIG. 4. However, the other configuration is the same as that of FIG. 4.

FIG. 18 is a circuit diagram showing internal configuration of the potential comparing circuit 3. In the potential comparing circuit 3 of FIG. 18, the resistor dividing circuits 21 and 22, the differential amplifier 23 and the source terminals of the PMOS transistor Q2 are supplied with the output voltage VLS of the level shift circuit 41. In this point, the circuit of FIG. 18 is different from that of FIG. 6. However, the other configuration is the same as that of FIG. 6.

FIG. 19 is a circuit diagram showing internal configuration of the potential comparing circuit 4. Even in the potential comparing circuit 4 of FIG. 19, the resistor dividing circuit 31, the differential amplifier 32 and the source terminal of the PMOS transistor Q4 are supplied with the output voltage VLS of the level shift circuit 41. In this point, the circuit of FIG. 19 is different from that of FIG. 6. However, the other configuration is the same as that of FIG. 8.

Thus, according to the third embodiment, the VLS detecting circuit 2a and the potential comparing circuits 3 and 4 are driven by using the output voltage VLS of the level shift circuit 41 as the power supply voltage. Because of this, for example, when only the power supply potential VDD becomes lower than the operational voltage range of the internal power supply generating circuit 5 and the internal circuit 6, not only the operation of the internal power supply generating circuit 5 is stopped and the internal circuit 6 is initialized, but the supply of the power supply for the VLS detecting circuit 2a and the potential comparing circuits 3 and 4 is stopped. Because of this, it is possible to cut off the current passing from the power supply potential VCC through the ground terminal in these circuits, thereby reducing the consumption current.

Other Embodiment

In the above-mentioned embodiments, an example in which the present invention is applicable to the semiconductor device has been described. However, the present invention can realize even in forms besides the semiconductor device. For example, the present invention can realize by combining hardware and software.

Figure 20:
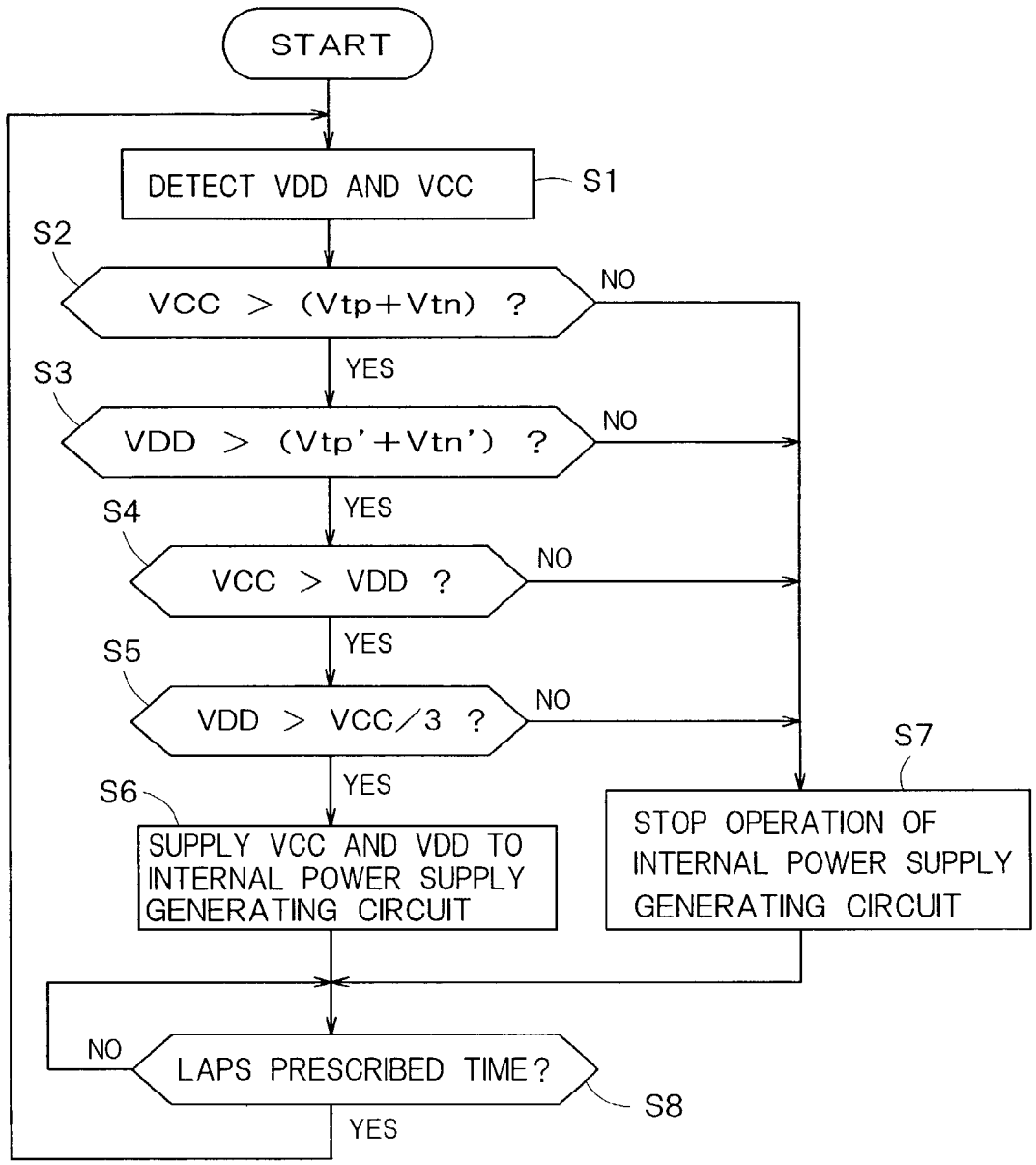
FIG. 20 is a flowchart showing processing operation of a control circuit.

FIG. 20 is a flowchart showing an example in which the control circuit 7 of FIG. 3 operates by software. The processings of the flowchart of FIG. 20 are begun after the power supply of a system, for example, the semiconductor device, is turned on. First of all, the power supply potentials VDD and VCC are detected by the VDD detecting circuit 1 and the VCC detecting circuit 2, respectively (step S1).

Subsequently, it is determined whether or not to be VCC>(Vtp'+Vtn') (step S2). If this determination is yes, it is determined whether or not to be VCC>VDD (step S4). If this determination is yes, it is determined whether or not to be VDD>VCC/3 (step S5). If this determination is yes, the internal power supply generating circuit 5 is supplied with the external power supplies VCC and VDD (step S6).

On the other hand, if at least one determination of steps S2-S4 is no, operation of the internal power supply generating circuit 5 is stopped, and the internal circuit 6 is initialized (step S7).

If the processings of steps S6 and S7 are finished, it is determined whether or not a prescribed time lapses (step S8). If the prescribed time lapses, the processings on and after step S1 are repeated.

Thus, when the control circuit 7 is composed of software, it is possible to perform the above-mentioned control by using the controller and so on provided on the semiconductor chip by the different purposes in nature, thereby reducing the occupied area of the chip.

The processing of step S5 of FIG. 20 may be omitted. The control circuit 7 in the semiconductor device of FIG. 12 may perform processings by software. In this case, instead of the processing of step S3 of FIG. 20, the same processing as that of the level shift circuit 41 may be performed.

What is claimed is:

1. A semiconductor device which operates an internal circuit based on first and second power supply potentials different from each other, comprising:
   a first determination circuit which determines whether or not said first power supply potential is higher than a first reference potential;
   a second determination circuit which determines whether or not said second power supply potential is higher than a second reference potential;
   a third determination circuit which determines whether or not said first power supply potential is higher than said second power supply potential;
   a fourth determination circuit which determinates whether or not said second power supply potential is larger than a voltage value obtained by multiplying a prescribed value which is larger than 0 and less than 1 by said first power supply potential; and
   a power supply voltage control circuit which operates said internal circuit based on said first and second power supply potentials if all the determinations by said first, second, third and fourth determination circuits are "yes", and outputs a signal for initializing said internal circuit if the determination by at least one of said first, second, third and fourth determination circuits is "no" in order to stop the operation of said internal circuit when at least one of said first and second power supply potentials instantaneously stops or breaks, or potential levels of said first and second power supply potentials are inverted.

2. The semiconductor device according to claim 1, wherein said prescribed value is set based on threshold values of transistors in said semiconductor devices.

3. The semiconductor device according to claim 1, further comprising:
   an internal power supply generating circuit which generates an internal potential for driving said internal circuit, based on said first and second power supply potentials,
   wherein said power supply voltage control circuit operates said internal power supply generating circuit based on said first and second power supply potentials if all the determinations in said first to fourth determination circuits are "yes", and stops operation of said internal power supply generating circuit if the determination in at least one of said first to fourth detennination circuits is "no".

4. The semiconductor device according to claim 1, wherein potential level of said first power supply potential is higher than that of said second power supply potential.

5. A semiconductor device which operates an internal circuit based on first and second power supply potentials different from each other, comprising:
   a first determination circuit which determines whether or not said first power supply potential is higher than a first reference potential;
   a level shift circuit which outputs said first power supply potential only when said second power supply potential is not less than a prescribed power supply potential;
   a second determination circuit which determines whether or not said first power supply potential is higher than said second power supply potential;
   a third determination circuit which determines whether or not said second power supply potential is larger than a voltage value obtained by multiplying a prescribed value more than 0 and less than 1 by said first power supply; and
   a power supply voltage control circuit which operates said internal circuit based on said first and second power supply potentials if each determination in said first, second and third determination circuits are "yes" and said first power supply potential is outputted from said level shift circuit, and outputs a signal for initializing said internal circuit if the determination in at least one of said first, second and third determination circuits is "no", or if said first power supply potential is not outputted from said level shift circuit in order to stop the operation of said internal circuit when at least one of said first and second power supply potentials instantaneously stops or breaks, or potential levels of said first and second power supply potentials are inverted.

6. The semiconductor device according to claim 5, further comprising:
   an internal power supply generating circuit which generates an internal potential for driving said internal circuit, based on said first and second power supply potentials,
   wherein said power supply voltage control circuit operates said internal power supply generating circuit based on said first and second power supply potentials if all the determinations in said first to third determination circuits are "yes", and stops operation of said internal power supply generating circuit if the determination in at least one of said first to third determination circuits is "no".

7. The semiconductor device according to claim 5, wherein said first to third determination circuits operate the output voltage of said level shift circuit as a power supply voltage.

8. The semiconductor device according to claim 5, wherein the potential level of said first power supply potential is higher than that of said second power supply potential in static state.

9. A method of controlling power supply voltage which operates an internal circuit of a semiconductor device based on first and second power supply potentials different from each other, comprising:
   a) determining whether said first power supply potential is higher than a first reference potential;
   b) determining whether said second power supply potential is higher than a second reference potential;
   c) determining whether said first power supply potential is higher than said second reference potential;
   d) determining whether or not said second power supply potential is larger than a voltage value obtained by multiplying a prescribed value more than 0 and less than 1 by said first power supply potential; and
   e) operating said internal circuit based on said first and second power supply potentials in the case where said first power supply potential is higher than said first reference potential, said second power supply potential is higher than said second reference potential, and said first power supply potential is higher than said second power supply potential, and said second power supply potential is larger than a voltage value obtained by multiplying a prescribed value more than 0 and less than 1 by said first power supply potential and initializing said internal circuit in the other case in order to stop the operation of said internal circuit when at least one of said first and second power supply potentials instantaneously stops or breaks, or potential levels of said first and second power supply potentials are inverted.

10. The method of controlling power supply voltage according to claim 9, wherein said prescribed value is set based on threshold voltages of transistors in said semiconductor device.

11. The method of controlling power supply voltage according to claim 9, further comprising:
   f) generating an internal potential for driving said internal circuit based on said first and second power supply potentials,
   wherein said d) generates said internal potential based on said first and second power supply potentials if all the determinations in said a), b), c) and e) are "yes", and stops operation of said internal circuit if the determination in at least one of said a), b), c) and e) is "no".

12. The method of controlling power supply voltage according to claim 9, wherein the potential level of said first power supply potential is higher than that of said second power supply potential in a static state.

13. A method of controlling power supply voltage which operates an internal circuit in a semiconductor device based on first and second power supply potentials different from each other, comprising:
   a) determining whether or not said first power supply potential is higher than a first reference potential;
   b) outputting said first power supply potential only when said second power supply potential is not less than a prescribed potential;
   c) determining whether or not said first power supply potential is higher than said second power supply potential;
   d) determining whether or not said second power supply potential is larger than a voltage value obtained by multiplying a prescribed value more than 0 and less than 1 by said first power supply potential; and
   e) operating said internal circuit based on said first and second power supply potentials in the case where it is determined that said first power supply potential is higher than said first reference potential, it is determined that said first power supply potential is higher than said second power supply potential, and said first power supply potential is outputted when said second power supply potential is not less than said prescribed potential, and said second power supply potential is larger than a voltage value obtained by multiplying a prescribed value more than 0 and less than 1 by said first power supply potential, and initializing said internal circuit in the other case in order to stop the operation of said internal circuit when at least one of said first and second power supply potentials instantaneously stops or breaks, or potential levels of said first and second power supply potentials are inverted.

14. The method of controlling power supply voltage according to claim 13, wherein said prescribed value is set based on threshold values of transistors in said semiconductor device.

15. The method of controlling power supply voltage according to claim 13, further comprising:
   f) generating an internal potential for driving said internal circuit based on said first and second power supply potentials,
   wherein said d) generates said internal potential based on said first and second power supply potentials if all the determinations in said a), b), c) and e) are "yes", and stops operation of said internal circuit if the determination in at least one of said a), b) c) and e) is "no".

16. The method of controlling power supply voltage according to claim 13, wherein potential level of said first power supply potential is higher than that of said second power supply potential.

* * * * *